United States Patent
Ryu et al.

(10) Patent No.: US 9,640,575 B2
(45) Date of Patent: May 2, 2017

(54) SEMICONDUCTOR PACKAGE INCLUDING IMAGE SENSOR AND HOLDER WITH TRANSPARENT COVER AND ADHESIVE STOPPER

(71) Applicant: SAMSUNG ELECTRONICS CO., LTD., Suwon-si, Gyeonggi-Do (KR)

(72) Inventors: Hansung Ryu, Yongin-si (KR); Seungkon Mok, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/090,158

(22) Filed: Apr. 4, 2016

(65) Prior Publication Data

US 2016/0218130 A1    Jul. 28, 2016

Related U.S. Application Data

(62) Division of application No. 14/152,421, filed on Jan. 10, 2014, now Pat. No. 9,324,748.

(30) Foreign Application Priority Data

Mar. 13, 2013 (KR) .......................... 10-2013-0026873

(51) Int. Cl.
*H01L 27/146* (2006.01)
*H01L 31/0203* (2014.01)

(52) U.S. Cl.
CPC ............ *H01L 27/14618* (2013.01); *H01L 2224/32225* (2013.01); *H01L 2224/48091* (2013.01);

(Continued)

(58) Field of Classification Search
CPC ...................... H01L 27/14618; H01L 31/0203
See application file for complete search history.

(56) References Cited

U.S. PATENT DOCUMENTS 4,295,152 A * 10/1981 Khoe ................. G02B 6/4204
  257/434
4,967,262 A * 10/1990 Farnsworth ....... H01L 23/49555
  257/678

(Continued)

FOREIGN PATENT DOCUMENTS

JP    2000-150844    5/2000
JP    2006-303413    11/2006

(Continued)

*Primary Examiner* — Thanh V Pham
(74) *Attorney, Agent, or Firm* — F. Chau & Associates, LLC

(57) ABSTRACT

A semiconductor package includes a substrate, an image sensor chip mounted on the substrate, a holder disposed on the substrate and surrounding the image sensor chip, and the holder has an inner surface facing the image sensor chip and an outer surface opposite to the inner surface. The semiconductor package further includes a transparent cover combined with the holder, and the transparent cover is spaced apart from and faces the substrate. The holder includes: a hole penetrating the holder from the inner surface to the outer surface. In addition, the semiconductor package further includes a first stopper disposed in the hole and a second stopper disposed at a position corresponding to the hole on the outer surface of the holder.

3 Claims, 12 Drawing Sheets

(52) U.S. Cl.
CPC ........... *H01L 2224/48227* (2013.01); *H01L 2224/73265* (2013.01); *H01L 2924/15311* (2013.01)

(56) References Cited

U.S. PATENT DOCUMENTS

| | | |
|---|---|---|
| 5,302,778 A | 4/1994 | Maurinus |
| 6,919,218 B2 | 7/2005 | Shiraishi et al. |
| 2006/0279648 A1 | 12/2006 | Senba et al. |
| 2008/0237768 A1 | 10/2008 | Yajima et al. |
| 2013/0100343 A1 | 4/2013 | Oh |
| 2014/0264699 A1 | 9/2014 | Ryu et al. |

FOREIGN PATENT DOCUMENTS

| | | |
|---|---|---|
| JP | 2006-319126 | 11/2006 |
| KR | 1020070106190 | 11/2007 |
| KR | 1020100031377 | 3/2010 |
| KR | 1020100073336 | 7/2010 |
| KR | 1020120004082 | 1/2012 |

\* cited by examiner

SEMICONDUCTOR PACKAGE INCLUDING IMAGE SENSOR AND HOLDER WITH TRANSPARENT COVER AND ADHESIVE STOPPER

CROSS-REFERENCE TO RELATED APPLICATIONS

This application is a Division of co-pending U.S. patent application Ser. No. 14/152,421, filed on Jan. 10, 2014, which claims priority under 35 U.S.C. §119 to Korean Patent Application No. 10-2013-0026873, filed on Mar. 13, 2013, the disclosures of which are hereby incorporated by reference herein in their entirety.

The present disclosure relates to semiconductor packages and methods of manufacturing the same and, more particularly, to CMOS image sensor packages and methods of manufacturing the same.

Generally, image sensors may convert one or more dimensional optical information into an electrical signal. The image sensors may be categorized as any one of complementary metal-oxide-semiconductor (CMOS) image sensors and charge coupled device (CCD) image sensors. The image sensors may be applied to, for example, cameras, camcorders, multimedia personal computers, and/or monitoring cameras. The fields in which image sensors have been applied have been increased dramatically.

SUMMARY

Exemplary embodiments of the inventive concept may provide semiconductor packages with increased reliability.

Exemplary embodiments of the inventive concept may also provide methods of manufacturing a semiconductor package capable of preventing an image sensor chip from being damaged.

According to an exemplary embodiment, a semiconductor package may include: a substrate, an image sensor chip mounted on the substrate, a holder disposed on the substrate and surrounding the image sensor chip, and the holder having an inner surface facing the image sensor chip and an outer surface opposite to the inner surface. The semiconductor package may further include a transparent cover combined with the holder, and the transparent cover is spaced apart from and faces the substrate. The holder may include: a hole penetrating the holder from the inner surface to the outer surface. In addition, the semiconductor package may further include a first stopper disposed in the hole and a second stopper disposed at a position corresponding to the hole on the outer surface of the holder.

In an embodiment, the first stopper may be configured to close the hole.

In an embodiment, the hole may have a cone-shaped inner space, and the first stopper may have a cone-shape corresponding to the cone-shaped inner space of the hole.

In an embodiment, a diameter of an outer end of the hole formed in the outer surface of the holder may be greater than a diameter of an inner end of the hole formed in the inner surface of the holder.

In an embodiment, the first stopper may include: a first surface adjacent to the inner surface of the holder, and a second surface opposite to the first surface. The first surface may have a circular shape and the second surface may have a circular shape. A diameter of the first surface may be smaller than a diameter of the second surface.

In an embodiment, the first stopper may include: a first surface adjacent to the inner surface of the holder; and a second surface opposite to the first surface and adjacent to the outer surface of the holder, and a distance between the first surface and the second surface may be smaller than a distance between an outer end of the hole formed in the outer surface of the holder and an inner end of the hole formed in the inner surface of the holder.

In an embodiment, the second stopper may include: a vent-hole penetrating the second stopper and connected to the hole.

In an embodiment, the first stopper may include an engineering plastic.

In accordance with an exemplary embodiment, a method of manufacturing a semiconductor package may include: providing a package substrate, and providing an image sensor device. The image sensor device includes a substrate, an image sensor chip disposed on the substrate, a holder surrounding the image sensor chip and including a hole penetrating the holder, and a transparent cover combined with the holder. The method further includes forming a plurality of bumps between the image sensor device and the package substrate to electrically connect the image sensor device to the package substrate, and closing the hole to seal the image sensor device. The forming of the bumps may include: exhausting air in an inner space of the image sensor device surrounded by the holder out through the hole.

In an embodiment, the forming of the bumps may include: performing a soldering process at a temperature in the range of about 180 degrees Celsius to about 300 degrees Celsius.

In an embodiment, the providing of the image sensor device may include: providing a first stopper in the hole, and forming a second stopper on the holder. In this case, the holder may have an inner surface facing the image sensor chip and an outer surface opposite to the inner surface, and the second stopper may be formed at a position corresponding to the hole on the outer surface of the holder.

In an embodiment, the second stopper may include a vent-hole penetrating the second stopper, and the vent-hole may be formed at a position corresponding to the first stopper.

In an embodiment, a diameter of an inner end of the hole formed in the inner surface of the holder may be less than a diameter of an outer end of the hole formed in the outer surface of the holder.

In an embodiment, the closing of the hole to seal the image sensor device may include: applying an adhesive on the holder to form an adhesive stopper closing the hole.

In accordance with an embodiment, a semiconductor package is provided. The semiconductor package includes an image sensor device including a substrate, an image sensor chip mounted on the substrate, an adhesive layer disposed between the substrate and the image sensor chip and configured to bond the image sensor chip and the substrate to each other, a holder disposed on the substrate and surrounding the image sensor chip and having an inner surface facing the image sensor chip and an outer surface opposite to the inner surface. The holder includes a hole penetrating the holder from the inner surface to the outer surface.

In addition, the semiconductor package further includes a transparent cover combined with the holder, and the transparent cover is spaced apart from and faces the substrate, and there is a space between the image sensor chip and the transparent cover.

Also, the semiconductor package further includes an adhesive stopper disposed on the outer surface of the holder and sealing the hole closed, a package substrate disposed facing the image sensor device and a plurality of bumps including a conductive material disposed between the image sensor device and the package substrate. The image sensor device is electrically connected to the package substrate through the bumps.

BRIEF DESCRIPTION OF THE DRAWINGS

Exemplary embodiments of the inventive concept can be understood in more detail from the following detailed description taken in conjunction with the attached drawings.

DETAILED DESCRIPTION OF EXEMPLARY EMBODIMENTS

Figure 1:
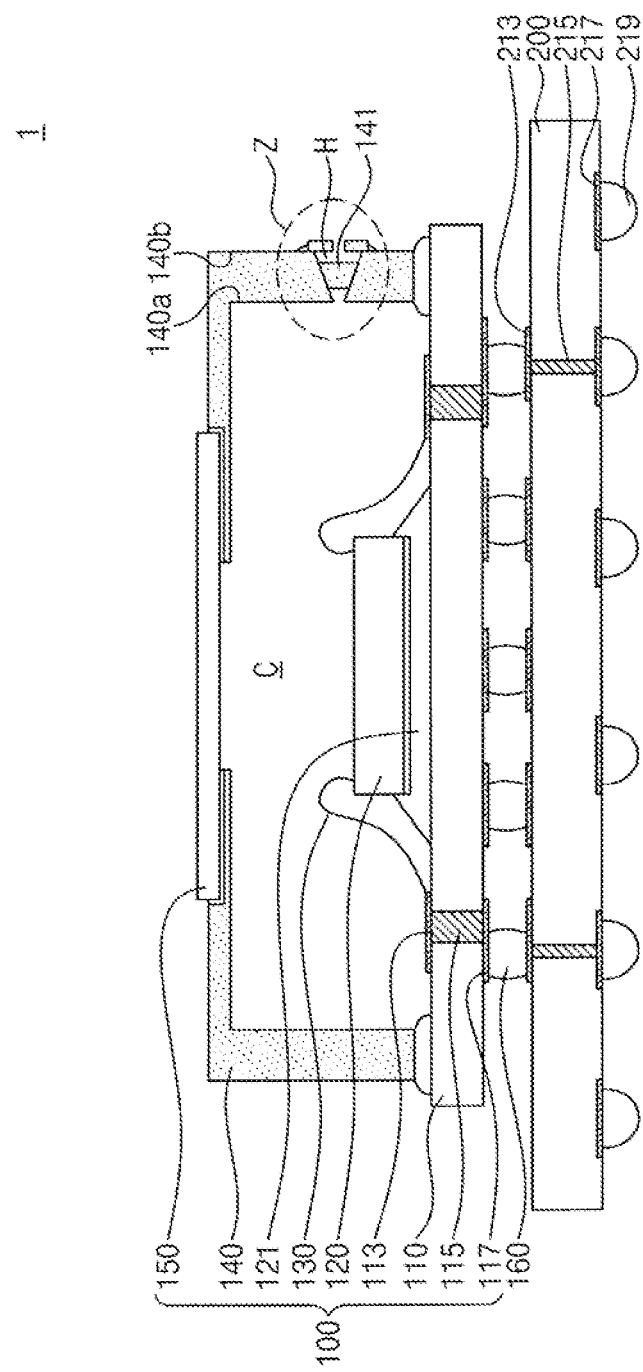
FIG. 1 is a cross-sectional view illustrating a semiconductor package according to an embodiment of the inventive concept.

Exemplary embodiments of the inventive concept will now be described more fully hereinafter with reference to the accompanying drawings, in which exemplary embodiments of the inventive concept are shown. It should be noted, however, that exemplary embodiments of the inventive concept are not limited to exemplary embodiments set forth herein, and may be implemented in various forms. In the drawings, embodiments of the inventive concept are not limited to the specific examples provided herein and may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The same reference numerals or the same reference designators denote the same elements throughout the specification.

[Semiconductor Package]

FIG. 1 is a cross-sectional view illustrating a semiconductor package according to an embodiment of the inventive concept.

Referring to FIG. 1, a semiconductor package 1 may be a surface mounting package including, for example, a package substrate 200 and an image sensor device 100 mounted on the package substrate 200. The image sensor device 100 may include, for example, a substrate 110, an image sensor chip 120, bonding wires 130, a holder 140, and a transparent cover 150. A space C may be provided between the image sensor chip 120 and the transparent cover 150.

The substrate 110 may be, for example, a printed circuit board (PCB) having patterns. The substrate 110 may include, for example, inner pads 113, through-via electrodes 115, and outer pads 117. The inner pads 113, the through-via electrodes 115, and/or the outer pads 117 may include, for example, a conductive material. The inner pads 113 may be disposed on a top surface of the substrate 110. The through-via electrodes 115 may penetrate the substrate 100 to electrically connect the inner pads 113 to the outer pads 117. The outer pads 117 may be disposed on a bottom surface of the substrate 110 and may be spaced apart from the inner pads 113.

The image sensor chip 120 may be disposed on the substrate 110. The image sensor chip 120 may include, for example, a CMOS image sensor (CIS) chip. The image sensor chip 120 may sense an image of an object and then may output an electrical signal. An adhesive layer 121 may be disposed between the substrate 110 and the image sensor chip 120. The image sensor chip 120 may be bonded to the substrate 110 by, for example, the adhesive layer 121. The adhesive layer 121 may include, for example, a photosensitive polymer and/or a thermosetting polymer. For example, the adhesive layer 121 may include a polyimide-based material and/or an epoxy-based material.

The bonding wires 130 may electrically connect the image sensor chip 120 to the inner pads 113 of the substrate 110. The image sensor chip 120 may be electrically connected to the package substrate 200 through the bonding wires 130. The bonding wires 130 may include, for example, a conductive material. For example, the bonding wires 130 may include gold (Au), aluminum (Al), copper (Cu), and/or any alloy thereof.

The holder 140 may be disposed on the substrate 110. The holder 140 may surround the image sensor chip 120. The holder 140 may be fixed on the substrate 110 to support the transparent cover 150. The holder 140 may include, for example, an inner surface 140a facing the image sensor chip 120 and an outer surface 140b opposite to the inner surface 140a. The holder 140 may include, for example, an engineering plastic (e.g., polycarbonate (PC) and/or a liquid crystal polymer (LCP)). The holder 140 may have at least one hole H.

Figure 2:
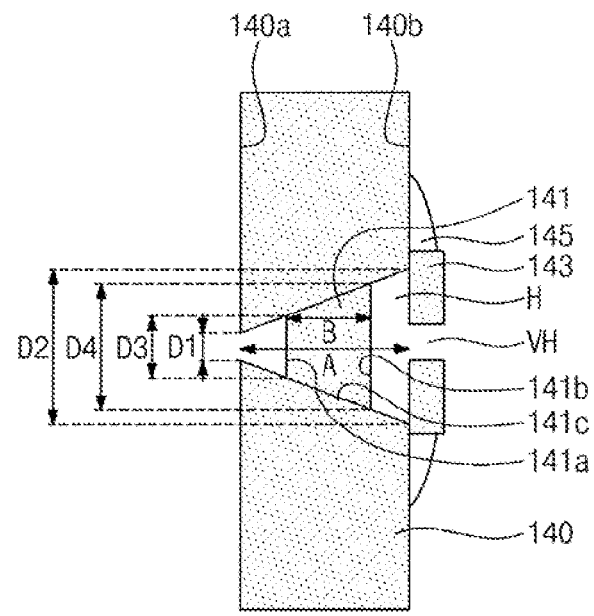
FIG. 2 is an enlarged view of a region 'Z' of FIG. 1.
Figure 3:
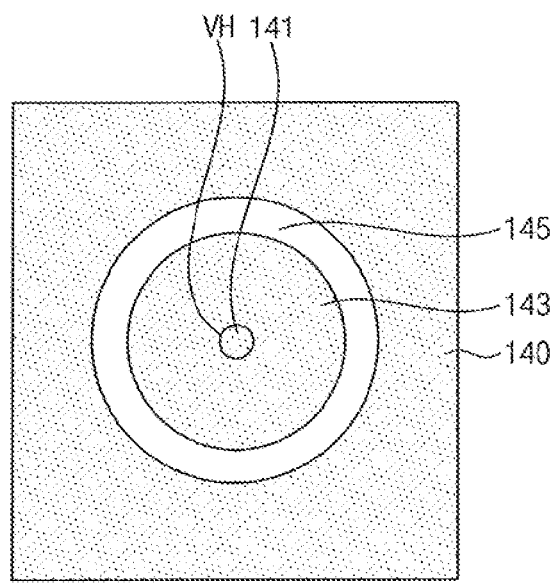
FIG. 3 illustrates an outer surface of a holder in a region 'Z' of FIG. 1.

FIG. 2 is an enlarged view of a region 'Z' of FIG. 1. FIG. 3 illustrates an outer surface of a holder in a region 'Z' of FIG. 1.

Referring to FIGS. 1, 2, and 3, the hole H may penetrate the holder 140 from the inner surface 140a of the holder 140 to the outer surface 140b of the holder 140. The hole H may be provided in a sidewall part or a top part of the holder 140. The hole H may have, for example, a cone-shaped inner space. For example, a cross-section of the hole H may have a trapezoid-shape. The hole H may have, for example, a circular shape or an elliptical shape when viewed in a direction from the outer surface 140b to the inner surface 140a. A diameter D1 of an inner end of the hole H provided in the inner surface 140a of the holder 140 may be, for example, less than a diameter D2 of an outer end of the hole H provided in the outer surface 140b of the holder 140.

A first stopper 141 may be disposed in the hole H to close the hole H. The first stopper 141 may include, for example, a first surface 141a, a second surface 141b opposite to the first surface 141a, and a side surface 141c connected between edges of the first and second surfaces 141a and 141b. The first surface 141a may face the inner surface 140a of the holder 140, and the second surface 141b may face the outer surface 140b of the holder 140. The first stopper 141 may have, for example, a shape corresponding to the inner space of the hole H. For example, the first stopper 141 may have a cone-shape corresponding to the cone-shaped inner space of the hole H. In an embodiment, the first stopper 141 may have a cross section of, for example, a trapezoid-shape. Each of the first and second surfaces 141a and 141b of the first stopper 141 may have, for example, a circular shape or an elliptical shape. A diameter D3 of the first surface 141a may be, for example, smaller than a diameter D4 of the second surface 141b. A distance A between the inner and outer ends of the hole H (e.g., a distance between the inner and outer surfaces 140a and 140b of the holder 140) may be, for example, greater than a distance B between the first and second surfaces 141a and 141b of the first stopper 141. The side surface 141c of the first stopper 141 may be in contact with the inner surface of the hole H. The first stopper 141 may include, for example, the same material as or a similar material to the holder 140. For example, the first stopper 141 may include an engineering plastic.

A second stopper 143 may be provided on the outer surface 140b of the holder 140. The second stopper 143 may be disposed at a position corresponding to the hole H. A vent-hole VH may penetrate the second stopper 143. The vent-hole VH may be disposed at a position corresponding to the hole H. The vent-hole VH may be connected to the hole H. The vent-hole may have one of various shapes. One or more vent-holes VH may be formed in the second stopper 143. An adhesive part 145 may be provided on the outer surface 140b of the holder 140. The adhesive part 145 may surround the second stopper 143 to fix the second stopper 143 on the holder 140. The adhesive part 145 may include, for example, an epoxy-based material or a polyimide-based material.

The transparent cover 150 may be disposed on the top part of the holder 140. The transparent cover 150 may be spaced apart from the image sensor chip 120 and may face the image sensor chip 120. The transparent cover 150 may be, for example, hermetically combined with the holder 140 such that the space C may be provided between the transparent cover 150 and the image sensor chip 120. The transparent cover 150 may include, for example, transparent material (e.g., glass, quartz or plastic) to transmit light.

The package substrate 200 may be, for example, a printed circuit board (PCB). The package substrate 200 may include, for example, first pads 213, package through-via electrode 215, second pads 217, and external terminals 219. The first pads 213 may be disposed on one surface of the package substrate 200. The second pads 217 may be disposed on another surface opposite to the one surface of the package substrate 200. Each package through-via electrode 215 may penetrate the package substrate 200 to electrically connect one of the first pads 213 to one of the second pads 217. The external terminals 219 may be, for example, solder balls. The external terminals 219 may electrically connect the package substrate 200 to an external electronic device.

Bumps 160 may be disposed between the image sensor device 100 and the package substrate 200. The image sensor device 100 may be electrically connected to the package substrate 200 through the bumps 160. The bumps 160 may be connected between the outer pads 117 of the substrate 110 and the first pads 213 of the package substrate 200. Each bump 160 may have, for example, a solder ball-shape or a pillar-shape. The bumps 160 may include, for example, a conductive material. For example, the bumps 160 may include copper, aluminum, lead, tin, indium, bismuth, antimony, silver, and/or any alloy thereof.

Figure 4:
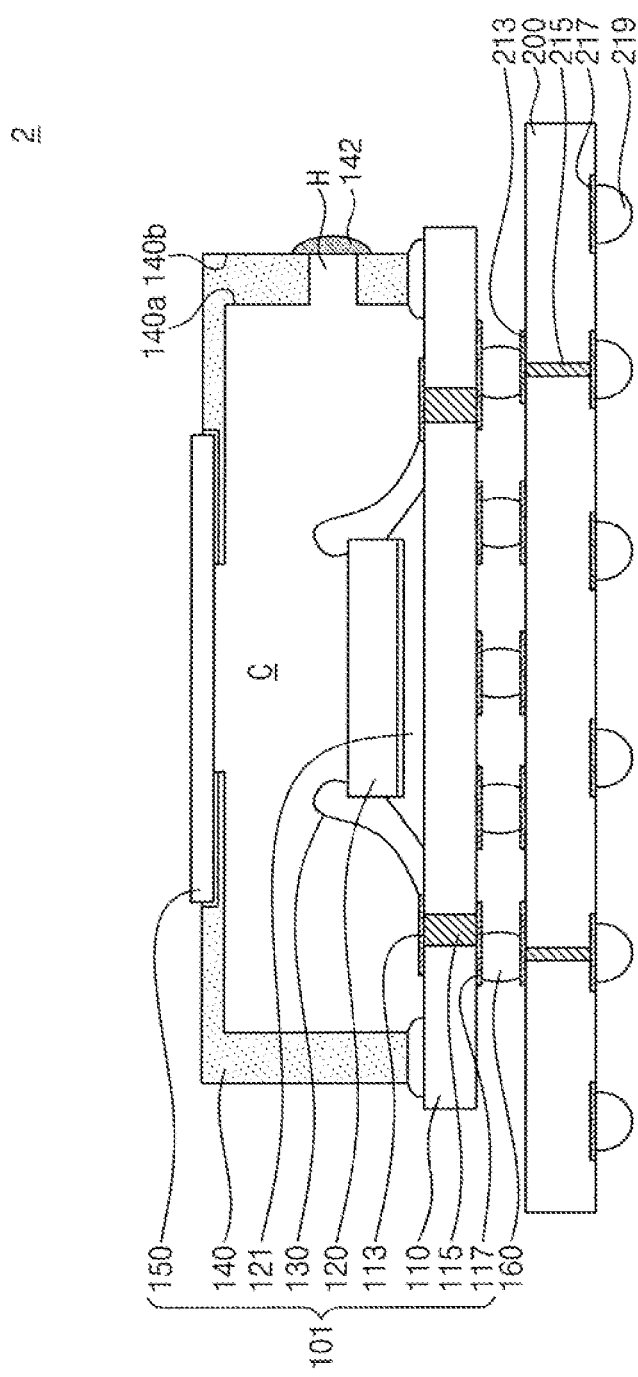
FIG. 4 is a cross-sectional view illustrating a semiconductor package according to an embodiment of the inventive concept.

FIG. 4 is a cross-sectional view illustrating a semiconductor package according to an embodiment of the inventive concept. In the present embodiment, the descriptions of the same elements as described above will be omitted or mentioned briefly for the purpose of ease and convenience in explanation.

Referring to FIG. 4, a semiconductor package 2 may be, for example, a surface mounting package including a package substrate 200 and an image sensor device 101 mounted on the package substrate 200. The image sensor device 101 may include, for example, a substrate 110, an image sensor chip 120, bonding wires 130, a holder 140, and a transparent cover 150. Bumps 160 may electrically connect the image sensor device 101 to the package substrate 200.

The holder 140 may have at least one hole H. The hole H may be formed in a sidewall part or a top part of the holder 140. The hole H may penetrate the holder 140 from an inner surface 140a of the holder 140 to an outer surface 140b of the holder 140. The hole H may have one of various shapes such as, for example, a cylindrical shape, a cone-shape, and a polygonal shape.

An adhesive stopper 142 may be disposed at a position corresponding to the hole H on the outer surface 140b of the holder 140. The adhesive stopper 142 may close the hole H. The adhesive stopper 142 may include, for example, an adhesive material (e.g., an epoxy-based material or a polyimide-based material).

[Method of Manufacturing Semiconductor Package]

Figure 5:
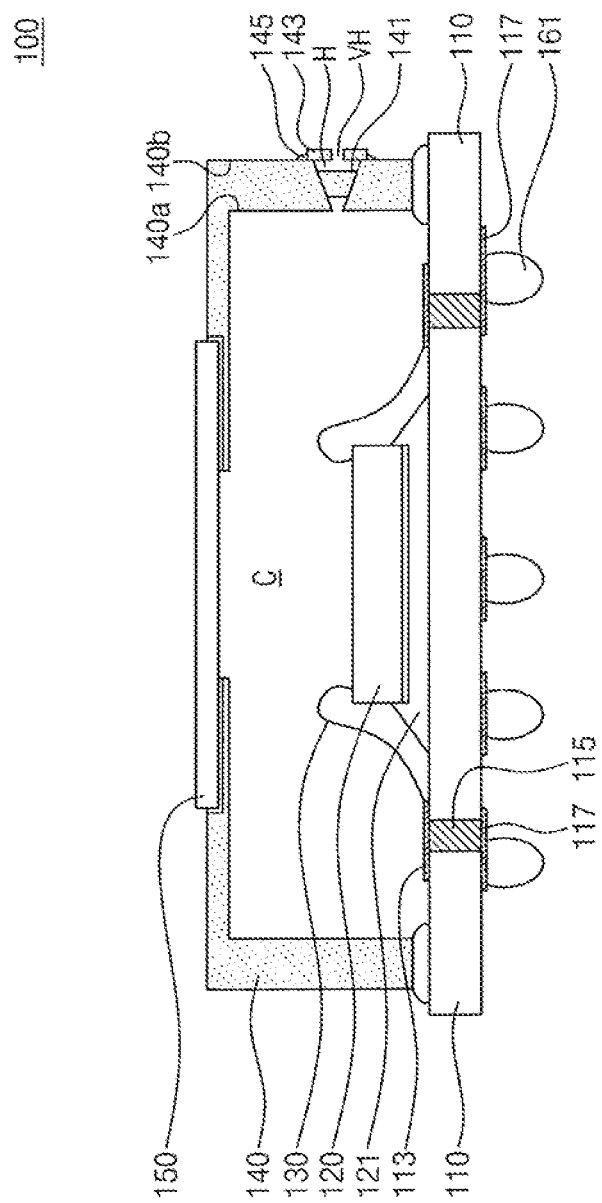
FIGS. 5 and 6 are cross-sectional views illustrating a method of manufacturing a semiconductor package according to an embodiment of the inventive concept.
Figure 6:
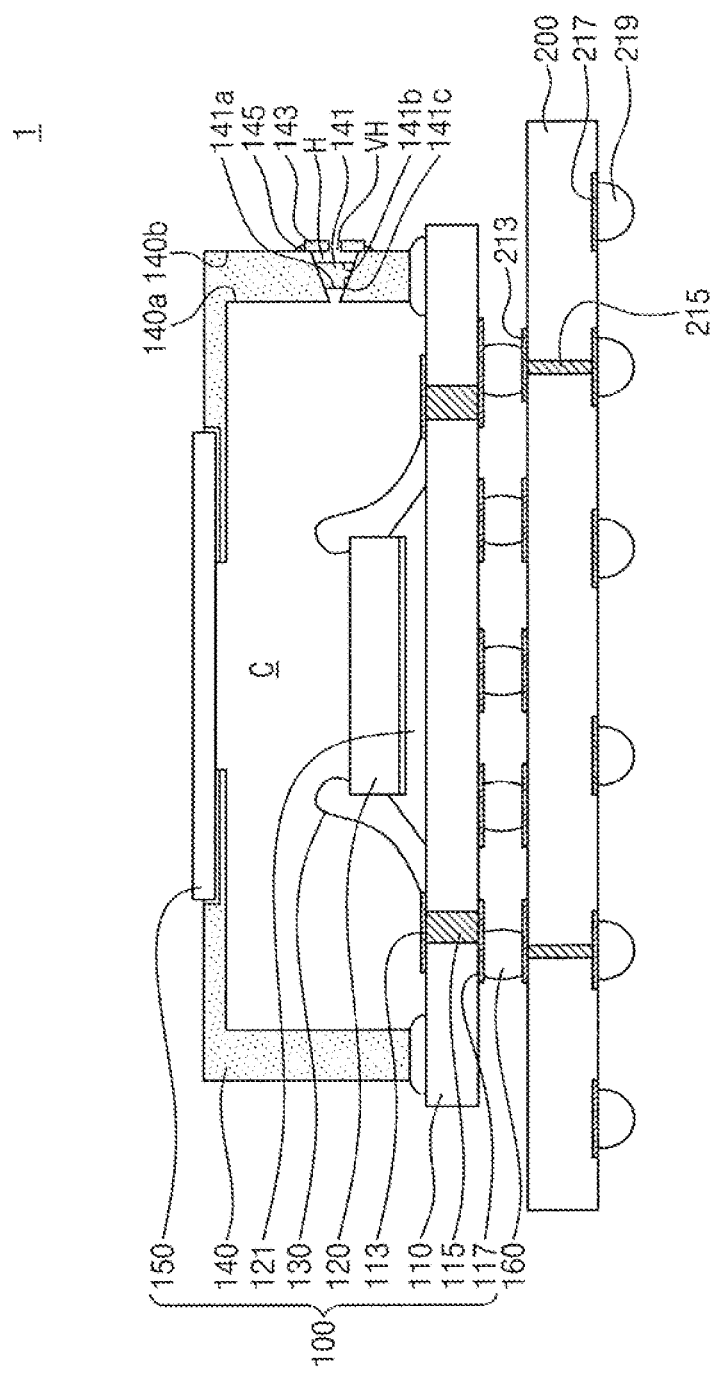

FIGS. 5 and 6 are cross-sectional views illustrating a method of manufacturing a semiconductor package according to an embodiment of the inventive concept. In the present manufacturing method, the same descriptions as described above will be omitted or mentioned briefly for the purpose of ease and convenience in explanation.

Referring to FIG. 5, the image sensor device 100 described with reference to FIG. 1 may be provided. For example, the image sensor chip 120 may be bonded to the substrate 110 through the adhesive layer 121 and then the holder 140 may be fixed on the substrate 110. Subsequently, the transparent cover 150 may be combined with the holder 140. The holder 140 may have, for example, a hole H. The hole H penetrates the holder 140. The holder 140 may include the first stopper 141 and the second stopper 143. The first stopper 141 may be disposed in the hole H and the second stopper 143 may be disposed on the outer surface 140b of the holder 140. A housing process of combining the transparent cover 150 with the holder 140 may include, for example, applying an adhesive to the transparent cover 150 or the holder 140, and hardening the adhesive. Pressure in the space C of the image sensor device 100 may be increased in the process of hardening the adhesive by, for example, ultraviolet rays or heat. The hole H and the vent-hole VH may exhaust the high pressured air to the outside of the image sensor device 100. Bump parts 161 may be formed on the outer pads 117. The bump parts 161 may be formed before or after the combination of the holder 140 and the transparent cover 150.

Referring to FIG. 6, the image sensor device 100 may be mounted on the package substrate 200 through, for example, bumps 160. For example, in an embodiment, the image sensor device 100 may be located on the package substrate 200 such that the bump parts 161 of FIG. 5 face the package substrate 200. Thus, the bump parts 161 of FIG. 5 may become in contact with the first pads 213 of the package substrate 200. The bumps 160 may be formed by, for example, soldering the bump parts 161 of FIG. 5. In an embodiment, the bump parts 161 of FIG. 5 may include, for example, lead (Pb)-free solder. For example, the bump parts 161 of FIG. 5 may be soldered at a temperature in the range of about 180 degrees Celsius to about 300 degrees Celsius (e.g., about 245 degrees Celsius), thereby forming the bumps 160. If the soldering temperature is less than about 180 degrees Celsius, the bumps 160 may not be formed. The pressure of the space C may be increased during the mounting process using, for example, the soldering of the image sensor device 100. At this time, the hole H and the vent-hole VH may exhaust the high pressured air of the space C to the outside of the image sensor device 100. Thus, it is possible to prevent the image sensor device 100 from being damaged by the pressure in the mounting process.

Figure 7:
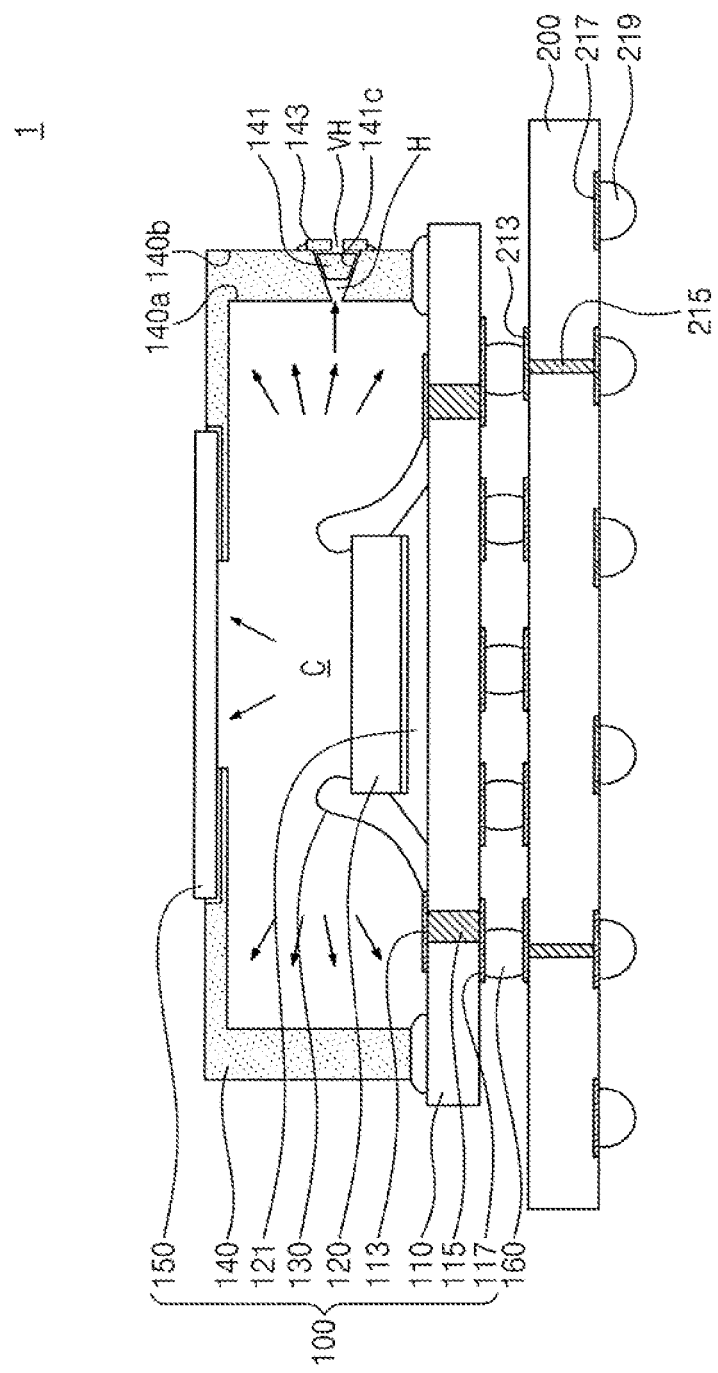
FIGS. 7 to 10 are cross-sectional views illustrating an operating principle of a first stopper according to internal pressure of an image sensor device.
Figure 8:
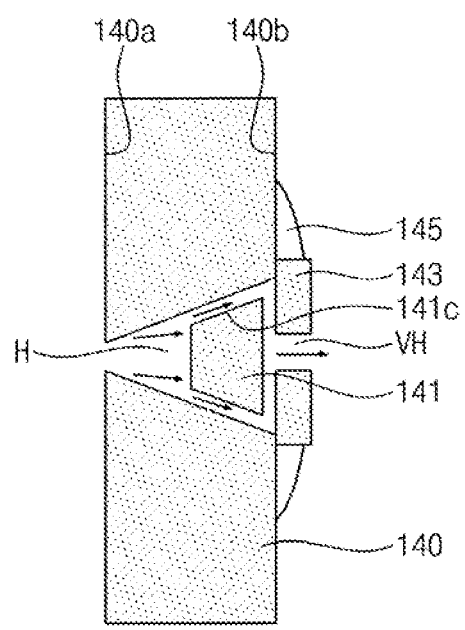
Figure 9:
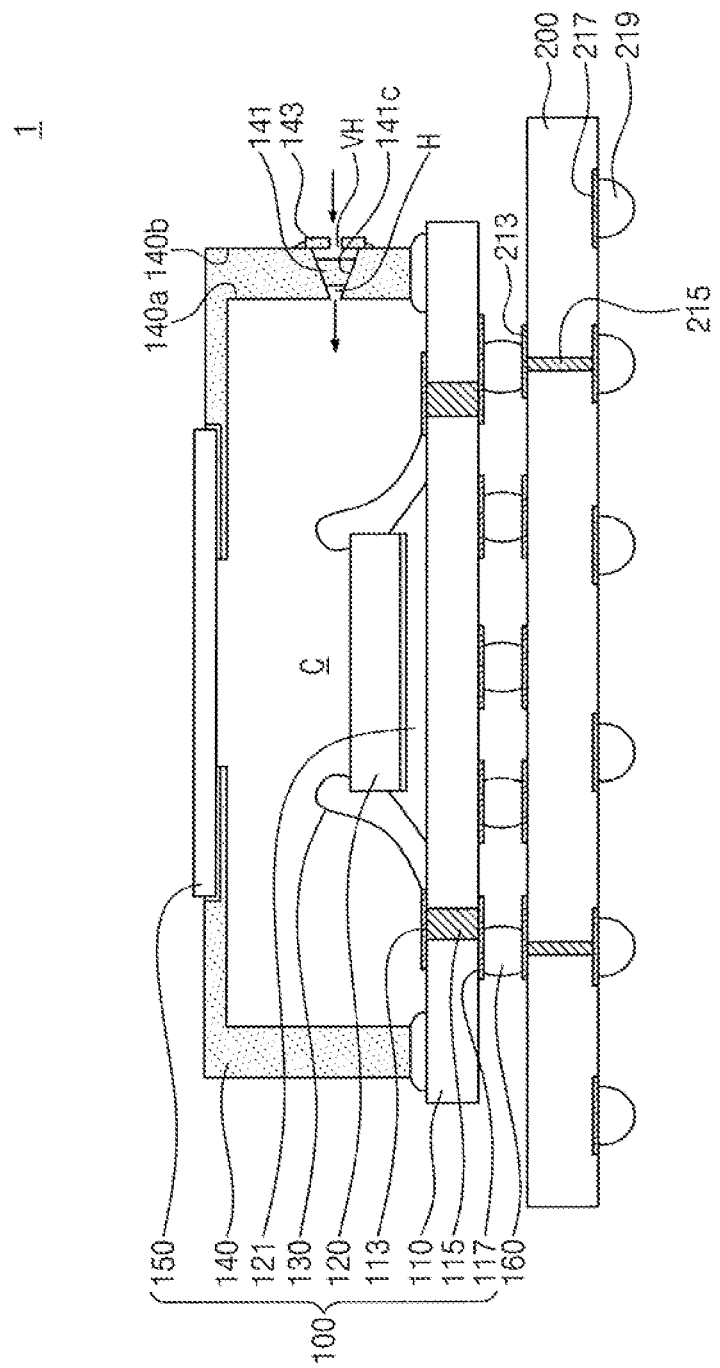
Figure 10:
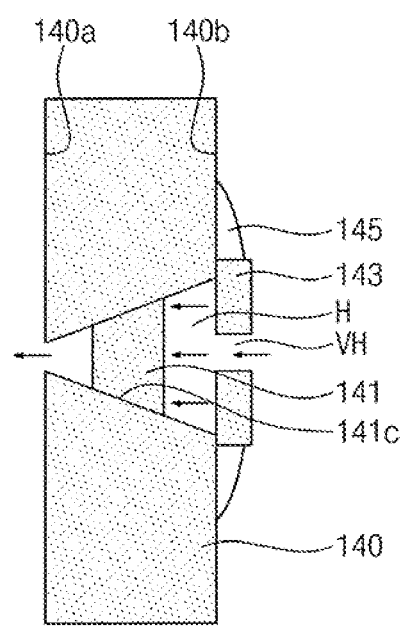

FIGS. 7 to 10 are cross-sectional views illustrating an operating principle of a first stopper according to internal pressure of an image sensor device. FIGS. 7 and 8 illustrate the image sensor device 100 and the package substrate 200 during the mounting process of the image sensor device 100. FIGS. 9 and 10 illustrate the image sensor device 100 and the package substrate 200 after the mounting of the image sensor device 100 is finished. Hereinafter, the same descriptions as described above will be omitted or mentioned briefly for the purpose of ease and convenience in explanation.

Referring to FIGS. 7 and 8, the inner pressure of the image sensor device 100 may be increased during the mounting process of the image sensor device 100. The first stopper 141 may be moved toward the outer surface 140b of the holder 140 such that the side surface 141c of the first stopper 141 may be separated from the inner surface of the hole H. That is, the side surface 141c of the first stopper 141 may be separated from the holder 140. Thus, the high pressured air in the space C may be exhausted through the hole H and the vent-hole VH to the outside of the image sensor device 100. The second stopper 143 may prevent the first stopper 141 from being outputted from the hole H.

Referring to FIGS. 9 and 10, if the mounting of the image sensor device 100 is finished, an inner temperature of the image sensor device 100 may be reduced. Thus, the inner pressure of the image sensor device 100 may be reduced. The first stopper 141 may be moved toward the inner surface 140a of the holder 140 such that the side surface 141c may become in contact with the inner surface of hole H. That is, the side surface 141c may become in contact with the holder 140. Thus, the first stopper 141 may close the hole H to seal the image sensor device 100. The first stopper 141 may prevent an external material from being inputted into the image sensor device 100. As a result, the first stopper 141 may protect the image sensor chip 120. The operating principle of the first stopper 141 may be applied to the process of housing the image sensor device 100.

Figure 11:
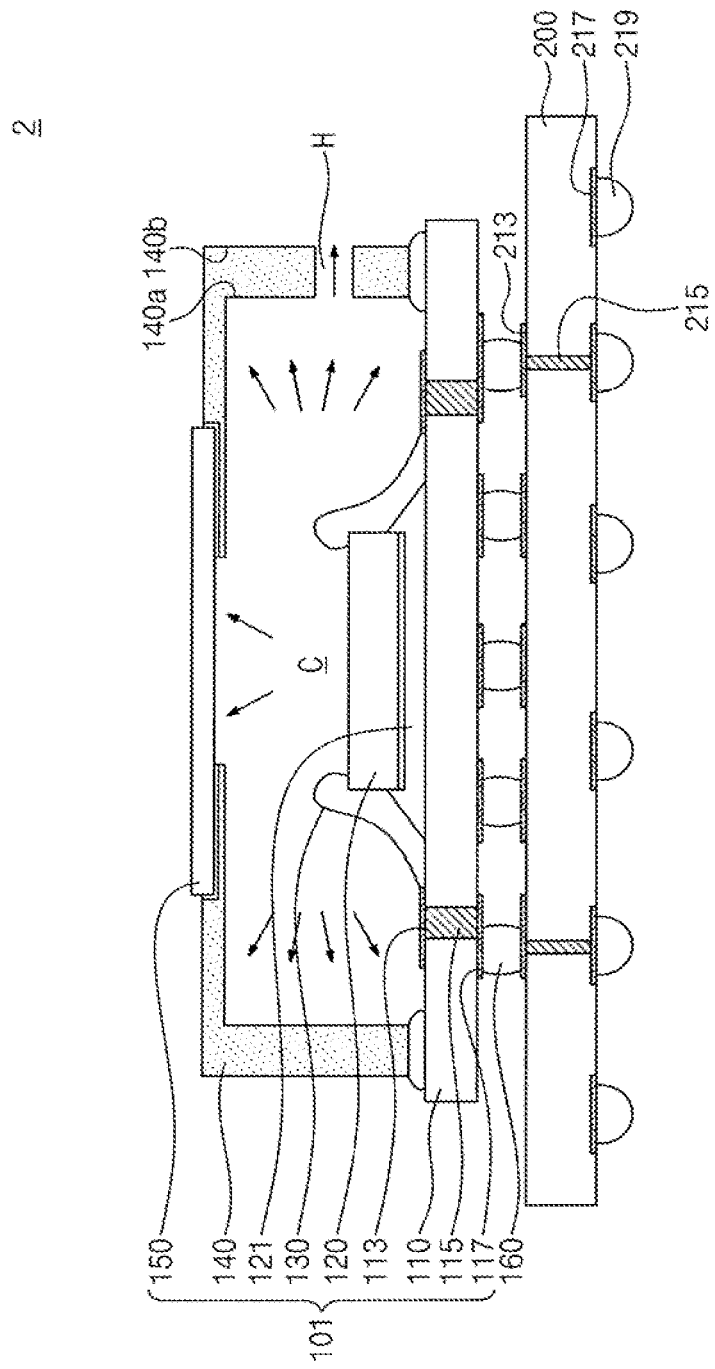
FIGS. 11 and 12 are cross-sectional views illustrating a method of manufacturing a semiconductor package according to an embodiment of the inventive concept.
Figure 12:
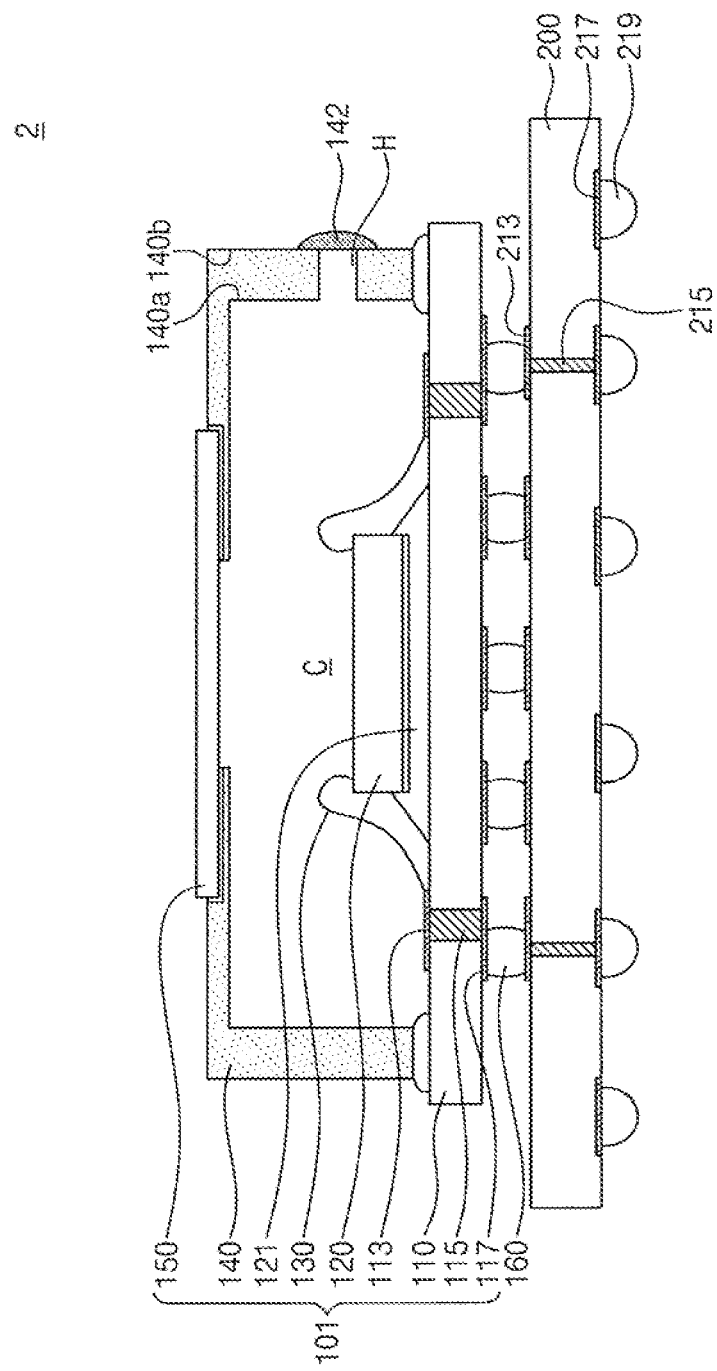

FIGS. 11 and 12 are cross-sectional views illustrating a method of manufacturing a semiconductor package according to an embodiment of the inventive concept. Hereinafter, the same descriptions as described above will be omitted or mentioned briefly for the purpose of ease and convenience in explanation.

Referring to FIG. 11, the image sensor device 101 described with reference to FIG. 4 may be provided. The image sensor device 101 may include the hole H penetrating the holder 140. A high pressured air in the image sensor device 101 may be exhausted through the hole H during the housing process of the transparent cover 150 and the holder 140.

The bumps 160 may be formed to mount the image sensor device 101 on the package substrate 200. The bumps 160 may be formed by, for example, a soldering process. The soldering process may be performed at a temperature in the range of, for example, about 180 degrees Celsius to about 300 degrees Celsius (e.g., about 245 degrees Celsius). At this time, a high pressured air in the image sensor device 101 may be exhausted through the hole H. As a result, the hole H may control an inner pressure of the image sensor device 101 to prevent the image sensor device 101 from being damaged.

Referring to FIG. 12, if the mounting of image sensor device 101 is finished, an inner temperature of the image sensor device 101 may be reduced. Thus, the inner pressure of the image sensor device 101 may be reduced. An adhesive stopper 142 may be formed on the outer surface 140b of the holder 140. For example, an adhesive may be applied to the outer surface 140b of the holder 140 to close the hole H. Thus, the adhesive stopper 142 may be formed. The adhesive stopper 142 may prevent an external material from being inputted into the image sensor device 101. Thus, the semiconductor package 2 illustrated in FIG. 4 may be manufactured.

[Applications]

Figure 13:
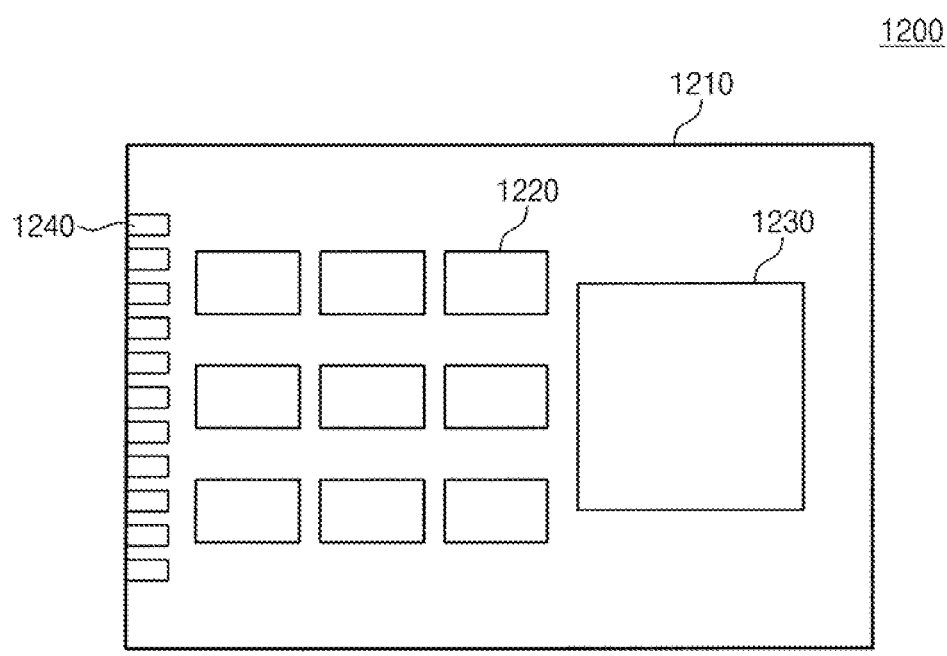
FIG. 13 illustrates an example of package modules including semiconductor packages according to an embodiment of the inventive concept.
Figure 14:
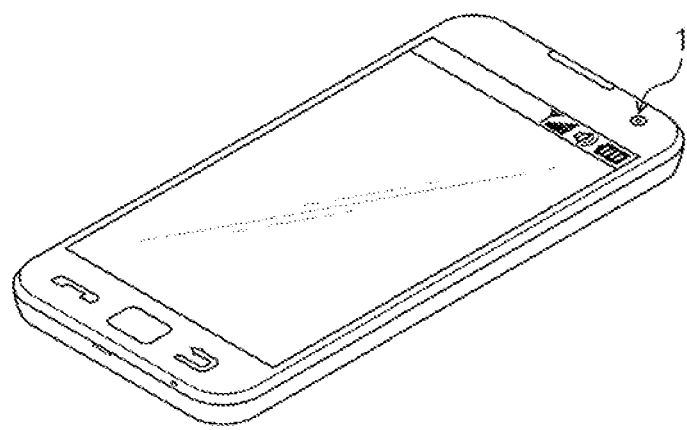
FIG. 14 is a perspective view illustrating an example of electronic devices including semiconductor packages according to an embodiment of the inventive concept.

FIG. 13 illustrates an example of package modules including semiconductor packages according to an embodiment of the inventive concept. FIG. 14 is a perspective view illustrating an example of electronic devices including semiconductor packages according to an embodiment of the inventive concept.

Referring to FIG. 13, a package module 1200 may include, for example, semiconductor integrated circuit devices 1220 and a quad flat packaged (QFP) semiconductor integrated circuit device 1230 which are mounted on a substrate 1210. The semiconductor integrated circuit devices 1220 and the QFP semiconductor integrated circuit device 1230 may include at least one of the semiconductor packages 1 and 2 according to an embodiment of the inventive concept. The package module may be electrically connected to an external electronic device through external connecting terminals provided on a side of the substrate 1210.

The semiconductor packages 1 and 2 mentioned with reference to FIGS. 1 and 4 may be applied to various electronic devices. Referring to FIG. 14, at least one of the aforementioned semiconductor packages 1 and 2 may be applied to, for example, mobile phone 2000. In this case, the applied semiconductor package 1 and/or 2 may be used as, for example, a digital camera of the mobile phone 2000. In an embodiment, the aforementioned semiconductor packages 1 and 2 may be applied to various electronic devices such as, for example, cameras, camcorders, personal digital assistants (PDAs), wireless phones, laptop computers, optical mice, facsimiles, and/or copying machines. In an embodiment, the semiconductor packages 1 and 2 may be applied to devices such as, for example, telescopes, mobile phone handsets, scanners, endoscopes, fingerprint recognition devices, toys, game consoles, mobile robots for home use, and/or cars.

According to embodiments of the inventive concept, the semiconductor package may include the holder having the hole penetrating the holder. The hole may exhaust the inner air of the image sensor device in the mounting process of the image sensor device as well as the housing process of the holder. Thus, the inner pressure of the image sensor device may be controlled to prevent damage to the image sensor device. When the mounting of the image sensor device is finished, the stopper may close the hole to prevent external material from being inputted into the inner space of the image sensor device.

Having described exemplary embodiments of the inventive concept, it is further noted that it is readily apparent to those of ordinary skill in the art that various modifications may be made without departing from the spirit and scope of the invention which is defined by the metes and bounds of the appended claims.

What is claimed is:

1. A semiconductor package comprising:
an image sensor device comprising:
a substrate,
an image sensor chip mounted on the substrate,
an adhesive layer disposed between the substrate and the image sensor chip and configured to bond the image sensor chip and the substrate to each other,
a holder disposed on the substrate and surrounding the image sensor chip, the holder having an inner surface facing the image sensor chip and an outer surface opposite to the inner surface, and wherein the holder includes a hole penetrating the holder from the inner surface to the outer surface,
a transparent cover combined with the holder, the transparent cover spaced apart from and facing the substrate, wherein there is a space between the image sensor chip and the transparent cover, and
an adhesive stopper disposed on the outer surface of the holder and sealing the hole closed;
a package substrate disposed facing the image sensor device; and
a plurality of bumps including a conductive material disposed between the image sensor device and the package substrate, wherein the image sensor device is electrically connected to the package substrate through the bumps.

2. The semiconductor package of claim 1, wherein the adhesive stopper comprises an epoxy-based material or a polyimide-based material, and wherein the adhesive layer comprises at least one of a photosensitive polymer and a thermosetting polymer.

3. The semiconductor package of claim 1, further comprising:
a plurality of inner pads disposed on a first surface of the substrate;
a plurality of outer pads disposed on a second surface of the substrate opposite to the first surface of the substrate and spaced apart from the inner pads;
a plurality of through-via electrodes penetrating the substrate and configured to electrically connect the inner pads to the outer pads,
a plurality of bonding wires configured to electrically connect the image sensor chip to the inner pads disposed on the substrate,
a plurality of first pads disposed on a first surface of the package substrate,
a plurality of second pads disposed on a second surface of the package substrate opposite to the first surface of the package substrate,
a plurality of package through-via electrodes penetrating the package substrate and configured to electrically connect the first pads to the second pads, and
a plurality of solder balls disposed on the second pads on the second surface of the package substrate.

* * * * *